United States Patent
Kapoor et al.

(10) Patent No.: US 10,877,864 B2
(45) Date of Patent: Dec. 29, 2020

(54) CONTROLLING SEGMENT LAYOUT IN A STRESS TEST FOR A PROCESSOR MEMORY WITH A LINK STACK

(71) Applicant: International Business Machines Corporation, Armonk, NY (US)

(72) Inventors: Shakti Kapoor, Austin, TX (US); Manoj Dusanapudi, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 189 days.

(21) Appl. No.: 16/226,765

(22) Filed: Dec. 20, 2018

(65) Prior Publication Data
US 2020/0201728 A1 Jun. 25, 2020

(51) Int. Cl.
*G06F 11/00* (2006.01)
*G06F 11/263* (2006.01)
*G06F 11/273* (2006.01)

(52) U.S. Cl.
CPC ........ *G06F 11/263* (2013.01); *G06F 11/2733* (2013.01)

(58) Field of Classification Search
CPC .. G06F 11/263; G06F 11/2733; G06F 9/4484; G06F 9/30134; G06F 9/30054
See application file for complete search history.

(56) References Cited

U.S. PATENT DOCUMENTS

| 8,291,381 | B2 | 10/2012 | Lai et al. |
| 9,542,290 | B1 | 1/2017 | Dusanapudi et al. |
| 9,779,251 | B2 | 10/2017 | Dalcher |
| 2006/0294346 | A1 | 12/2006 | Stempel et al. |
| 2015/0006855 | A1* | 1/2015 | Gschwind ............. G06F 9/3806 712/207 |
| 2016/0077834 | A1 | 3/2016 | de Perthuis |
| 2016/0321071 | A1 | 11/2016 | Hansen et al. |
| 2018/0267875 | A1* | 9/2018 | Dusanapudi .......... G06F 11/263 |

FOREIGN PATENT DOCUMENTS

GB    2486738 A    6/2012

* cited by examiner

*Primary Examiner* — Michael Maskulinski
(74) *Attorney, Agent, or Firm* — Martin & Associates LLC; Derek P. Martin

(57) ABSTRACT

A processor memory is stress tested with a variable link stack depth using test code segments and link stack test segments on non-naturally aligned data boundaries. Link stack test segments are interspersed into test code segments of a processor memory test to change the link stack depth without changing results of the test code. The link stack test segments include branch to target, push/pop, push and pop segments. The depth of the link stack is varied independent of the memory test code by changing the number to branches in the branch to target segment and varying the number of the push/pop segments. The link stack test segments and test segments may be placed randomly with a recursive algorithm to intersperse the link stack test segments in the test code segments and to reduce the amount of data to be saved and restored for all subroutine calls, push and pop segments.

20 Claims, 14 Drawing Sheets

810 Push Segment
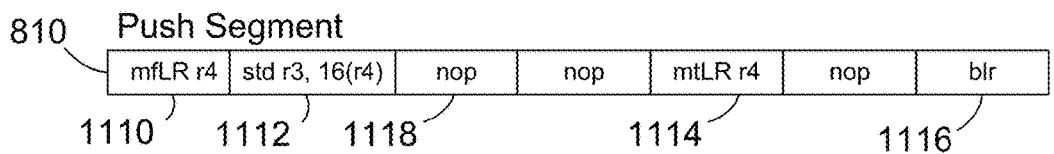
FIG. 11
812 Pop Segment
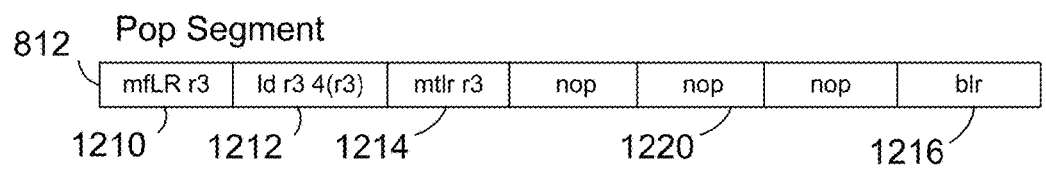
FIG. 12
|  | Col 1 | Col 2 | Col 3 | Col 4 | Col 5 | Col 6 | Col 7 |
|---|---|---|---|---|---|---|---|
| Row 1 | a1 | a2 | a3 | a4 | a5 | a6 | bc +112 |
| Row 2 | b1 | b2 | b3 | b4 | b5 | b6 | bc +112 |
| Row 3 | bcl tgt | bcl tgt | bcl tgt | nop | nop | nop | bc next |
| Row 4 | mfLR r3 | push | sub call | nop | pop | unused | LR save area |
| Row 5 | c1 | c2 | c3 | c4 | c5 | c6 | bc +112 |
| Row 6 | d1 | d2 | d3 | d4 | d5 | d6 | return |
| Row 7 | e1 | e2 | e3 | e4 | e5 | e6 | bc +112 |
| Row 8 | f1 | f2 | f3 | f4 | f5 | f6 | return |
| Row 9 | g1 | g2 | g3 | g4 | g5 | g6 | bc +112 |
| Row 10 | mfLR r3 | push | sub call | nop | pop | unused | LR save area |
| Row 11 | h1 | h2 | h3 | h4 | h5 | h6 | bc +112 |
| Row 12 | i1 | i2 | i3 | i4 | i5 | i6 | return |
FIG. 13

```
Layout_segments_recursively (Pointer, seed, bias)
{
    int temp_bias, temp_seed;

if(SPACE_Left <= TC Segments Left)   // Force TC Segment placement if running out of space
        bias = 1;
    else if(END_OF_TC_PAGE)              // If we are reaching the end of page, return recursively
        bias = 5
    else if ( NEXT_ROW_OCCUPIED)         // If next row is already occupied, take random jump
        bias = 2
    else
        bias = random (seed, bias)
    If (bias = 1)
    {   Check if entire test case segment can be placed or not
        if not, then fill with "nop" and go to next bc+112 location
        place segment
        update Current Pointer of Segment
        "Layout_segments_recursively(Current pointer, seed, bias)
    }
    If (bias = 2)
    {   take a random jump, place a random segment if space is free
        update Current Pointer of Segment
        "Layout_segments_recursively(Current pointer, seed, bias)
    }
    If (bias = 3)
    {   place random segment
        Layout_segments_recursively(Current pointer, seed, bias)

}
    If (bias = 4)
    {   Layout_segments_recursively(Current pointer, seed, bias)
    }
    If (bias = 5)
    {
        Go to the beginning of the page and search for empty segment space to place a segment
        Return to previous Layout_segments_recursively(Current pointer, seed, bias)
    }

# CONTROLLING SEGMENT LAYOUT IN A STRESS TEST FOR A PROCESSOR MEMORY WITH A LINK STACK

BACKGROUND

1. Technical Field

This disclosure generally relates to computer hardware testing and development, and more specifically relates to a system and method for controlling segment layout for stress testing a processor memory with a link stack using test code segments placed on non-naturally aligned data boundaries and interspersed with link stack test segments for varying the link stack depth.

2. Background Art

Processor testing tools attempt to generate the most stressful test case for a processor. In theory, the generated test case should provide maximum test coverage and should be able to stress various timing scenarios and operations on the processor, including the coherency of cache memory. Coherency in the cache memory involves insuring that changes to data in the cache are accurately reflected to main memory to keep the data consistent. Building test cases to thoroughly test a processor can be extremely costly in time and resources, thus building efficient test cases that can reuse test code is an important goal of processor testing.

Many processors have a link stack that stores return addresses when executing a branch in the code. A link register is typically used to access the last entry into the link stack. The processor may make predictions of software execution based on the content of the link stack to speed execution. Also, there are often limits to the depth of the link stack. Accommodations in the test software must be made to deal with errors that may be generated when the link stack depth is exceeded. It is difficult to generate test cases for memory that can also test the different scenarios of the link stack depth. Prior art test case generation was extremely labor intensive to develop stress tests for memory with different link stack depth scenarios.

BRIEF SUMMARY

A processor memory is stress tested with a variable link stack depth using test code segments and link stack test segments on non-naturally aligned data boundaries. Link stack test segments are interspersed into test code segments of a processor memory test to change the link stack depth without changing results of the test code. The link stack test segments include branch to target, push/pop, push and pop segments. The depth of the link stack is varied independent of the memory test code by changing the number to branches in the branch to target segment and varying the number of the push/pop segments. The link stack test segments and test segments may be placed randomly with a recursive algorithm to intersperse the link stack test segments in the test code segments and to reduce the amount of data to be saved and restored for subroutine calls, push and pop segments.

The foregoing and other features and advantages will be apparent from the following more particular description, as illustrated in the accompanying drawings.

BRIEF DESCRIPTION OF THE SEVERAL VIEWS OF THE DRAWING(S)

The disclosure will be described in conjunction with the appended drawings, where like designations denote like elements, and:

Figure 5:
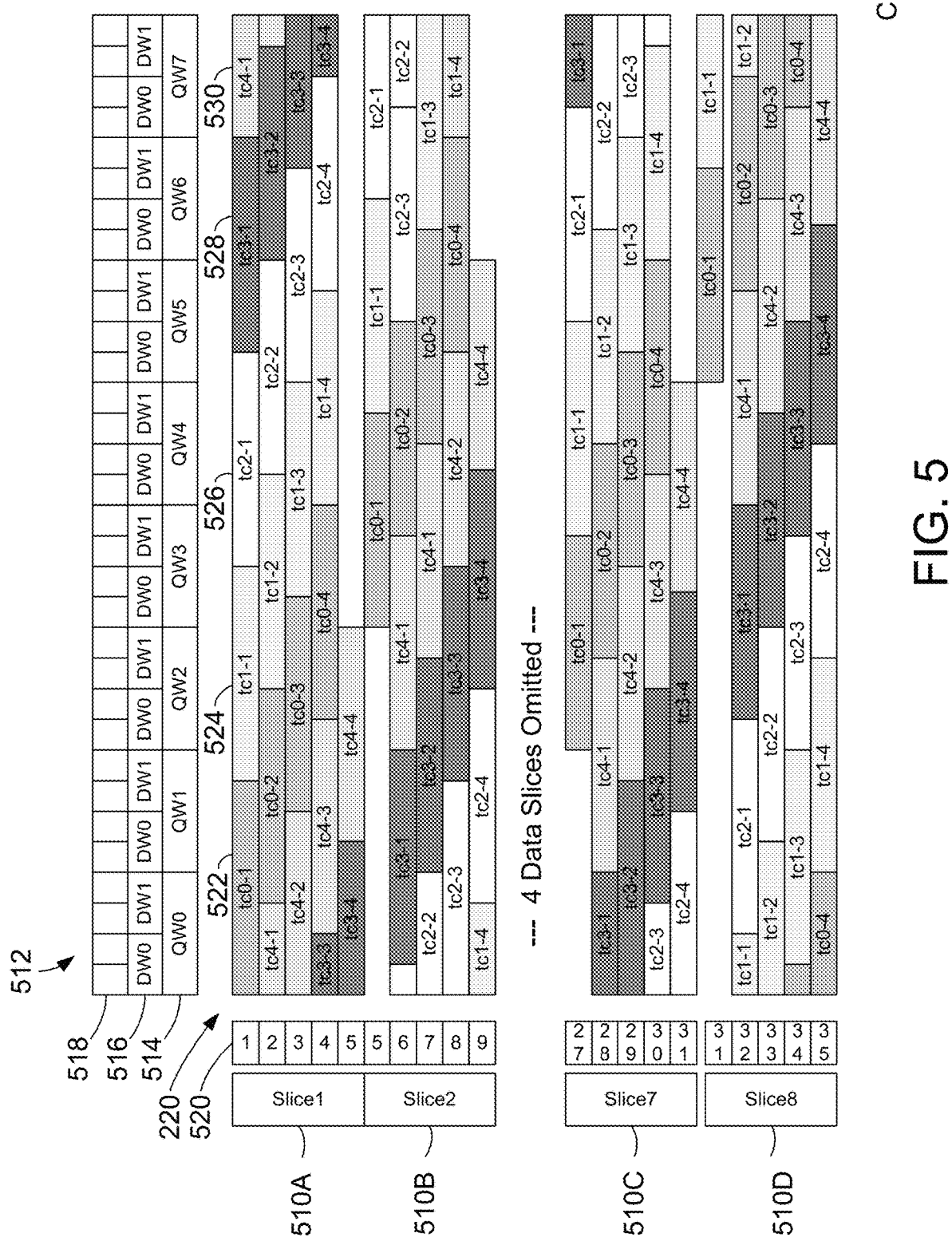
FIG. 5 illustrates successive slices of replicated test code and test data stored in a memory cache with non-naturally aligned data boundaries.
Figures 6, 7:
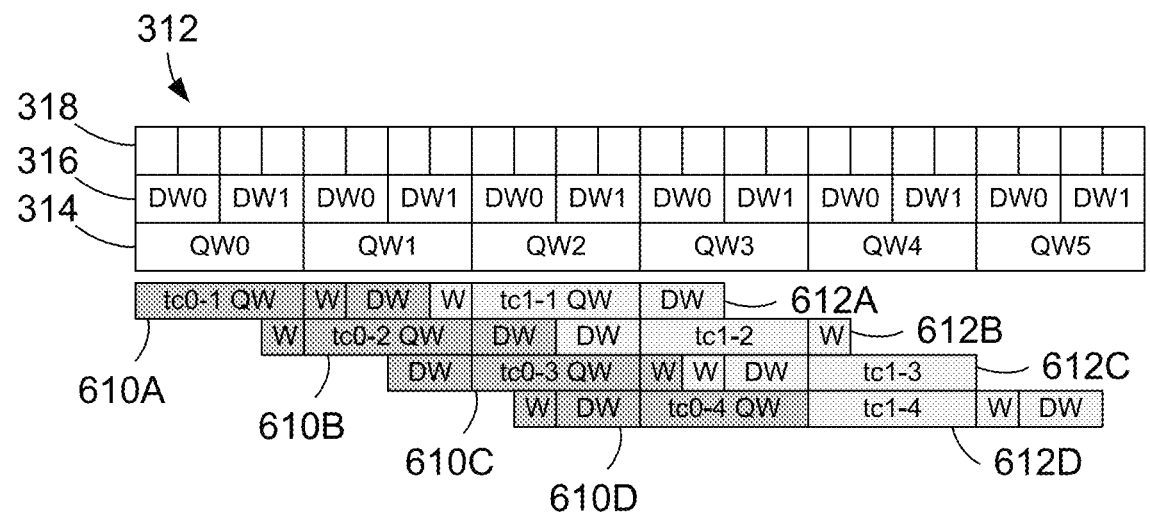
Figure 8:
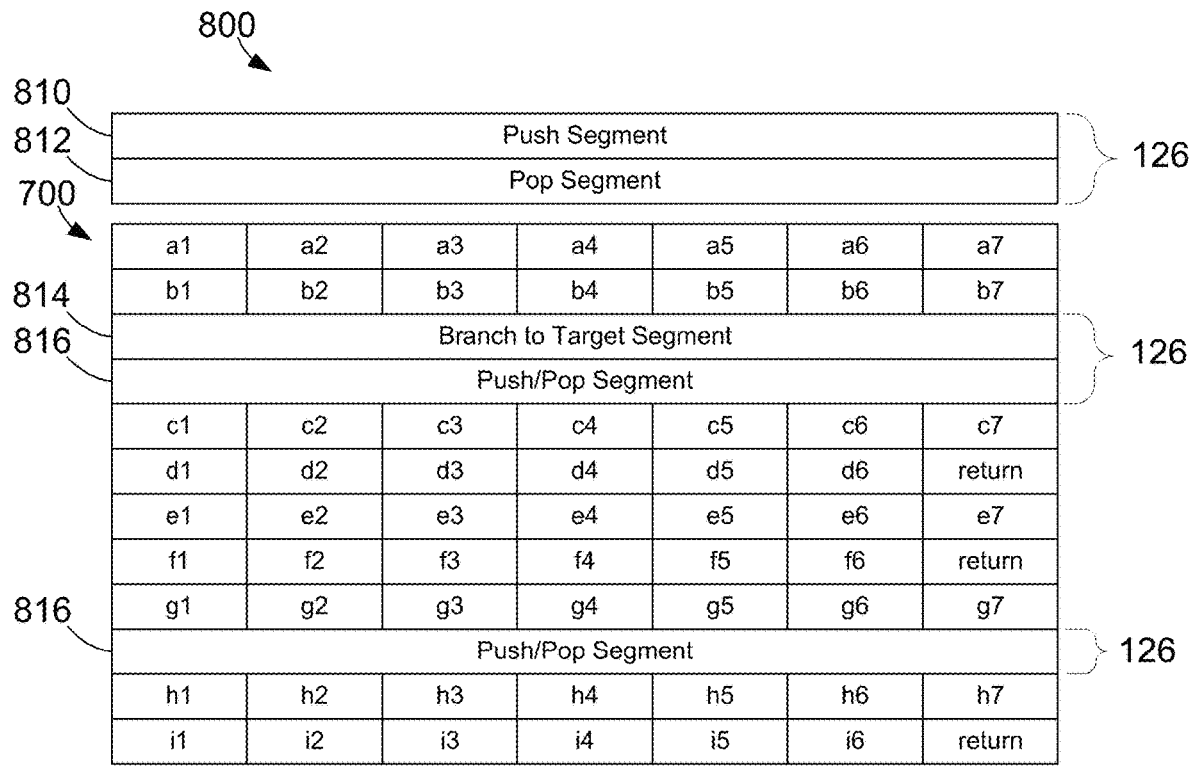
Figure 9:
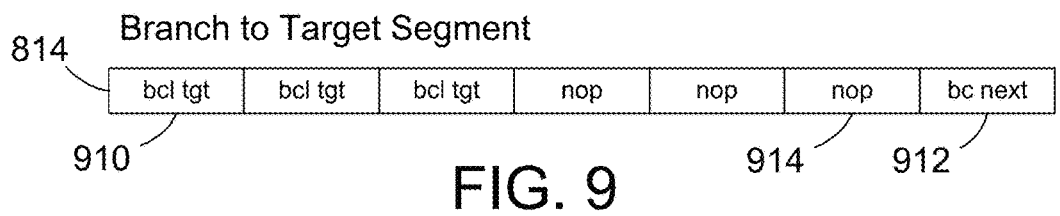
Figure 10:
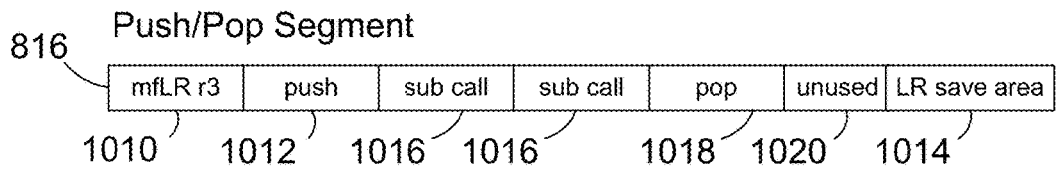
Figure 14:
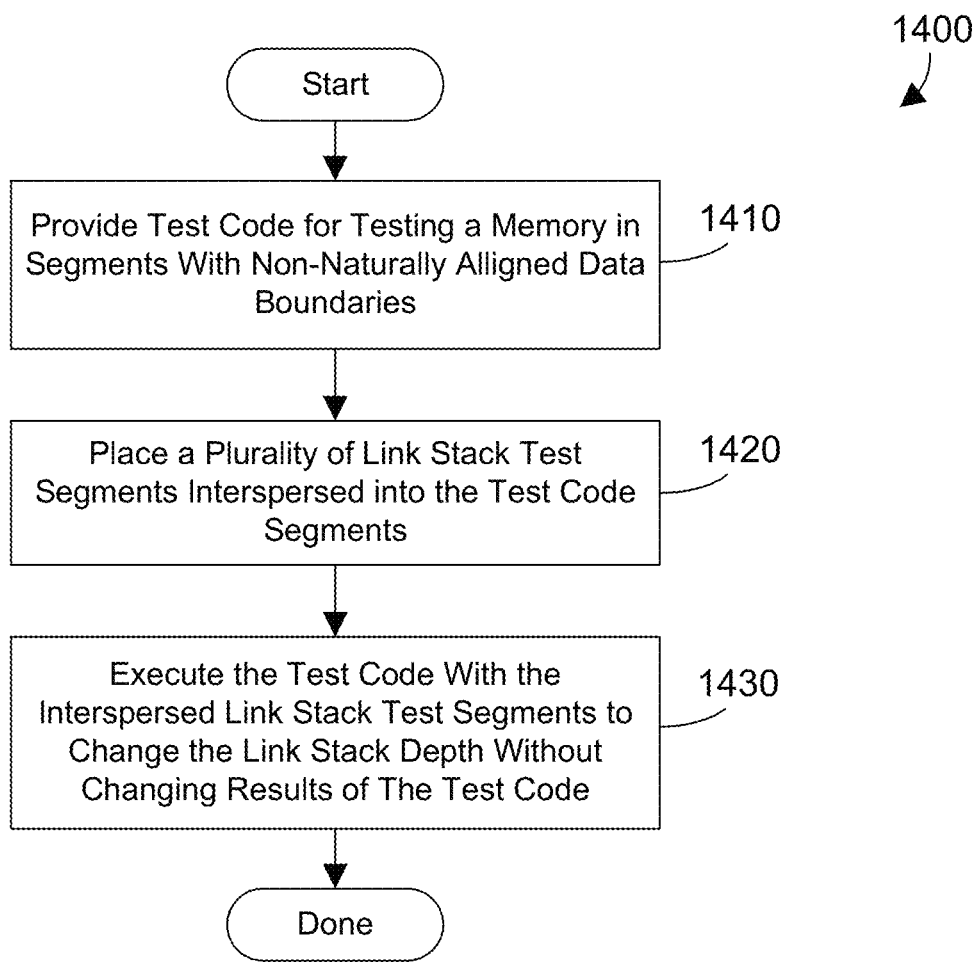
Figure 15:
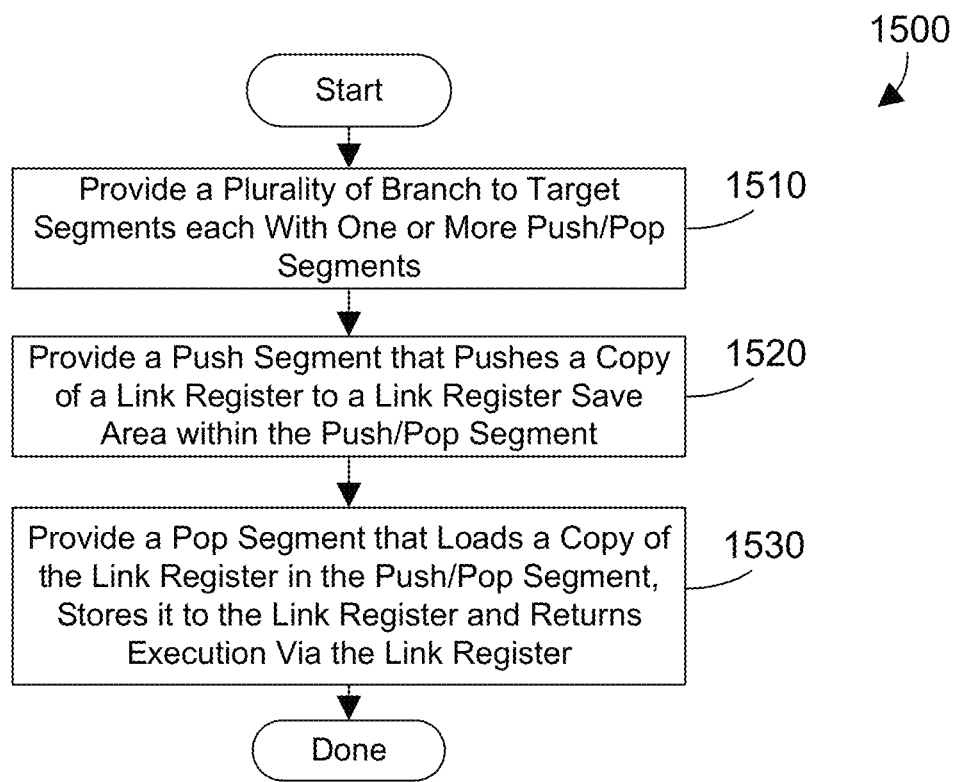

FIG. 6 further illustrates the test code segments in FIG. 5 having non-naturally aligned data boundaries;

FIG. 7 illustrates a portion of the memory cache shown in FIG. 5 with a strand of memory shown as a single block;

FIG. 8 illustrates another view of the same strand of memory shown in FIG. 7 modified to include link stack test segments to stress test memory with varying stack depth;

FIG. 9 illustrates an example of a branch to target segment;

FIG. 10 illustrates an example of a push/pop segment;

FIG. 11 illustrates an example of a push segment;

FIG. 12 illustrates an example of a pop segment;

FIG. 13 illustrates an example of stress testing a processor memory with a link stack using link stack test segments with non-naturally aligned data boundaries;

FIG. 14 is a flow diagram of a method for stress testing a processor memory cache with a variable link stack depth using link stack test segments with non-naturally aligned data boundaries;

FIG. 15 is a flow diagram of a specific method for step 1420 in FIG. 14.

Figure 16:
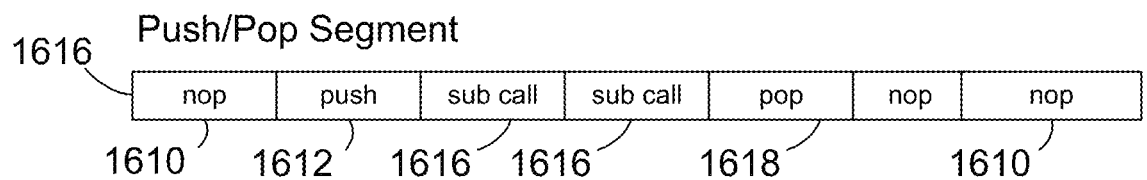
Figure 17A:
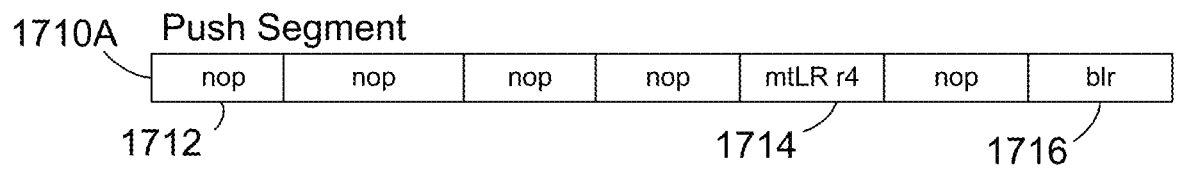
Figure 17B:
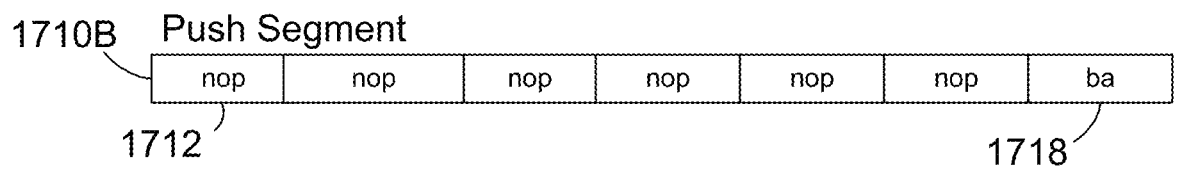
Figure 18:
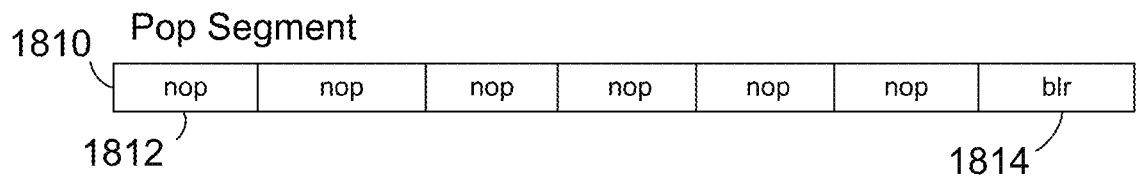

FIG. 16 illustrates an example of a push/pop segment;

FIG. 17A illustrates an example of a push segment;

FIG. 17B illustrates another example of a push segment;

FIG. 18 illustrates an example of a pop segment.

Figure 19:
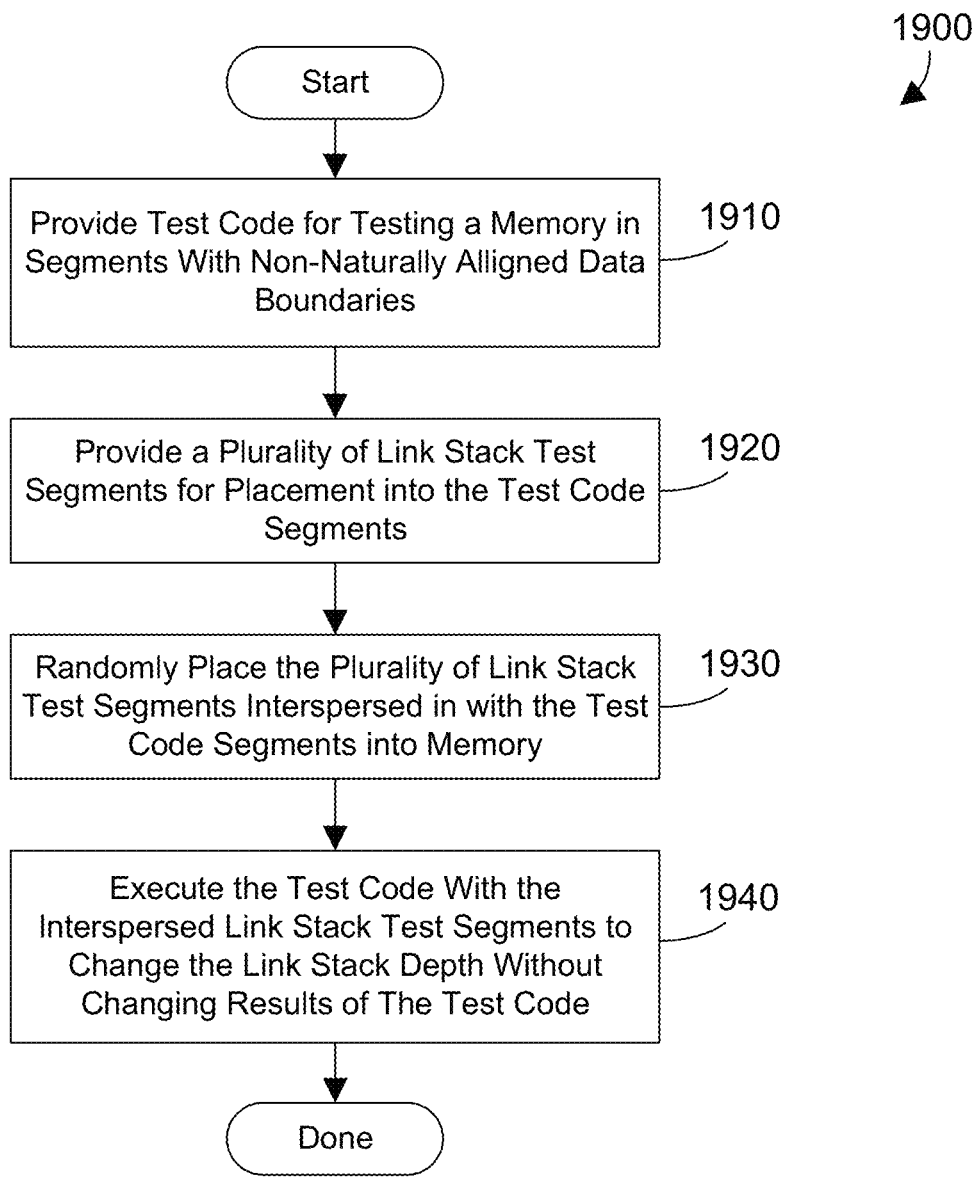
Figure 20:
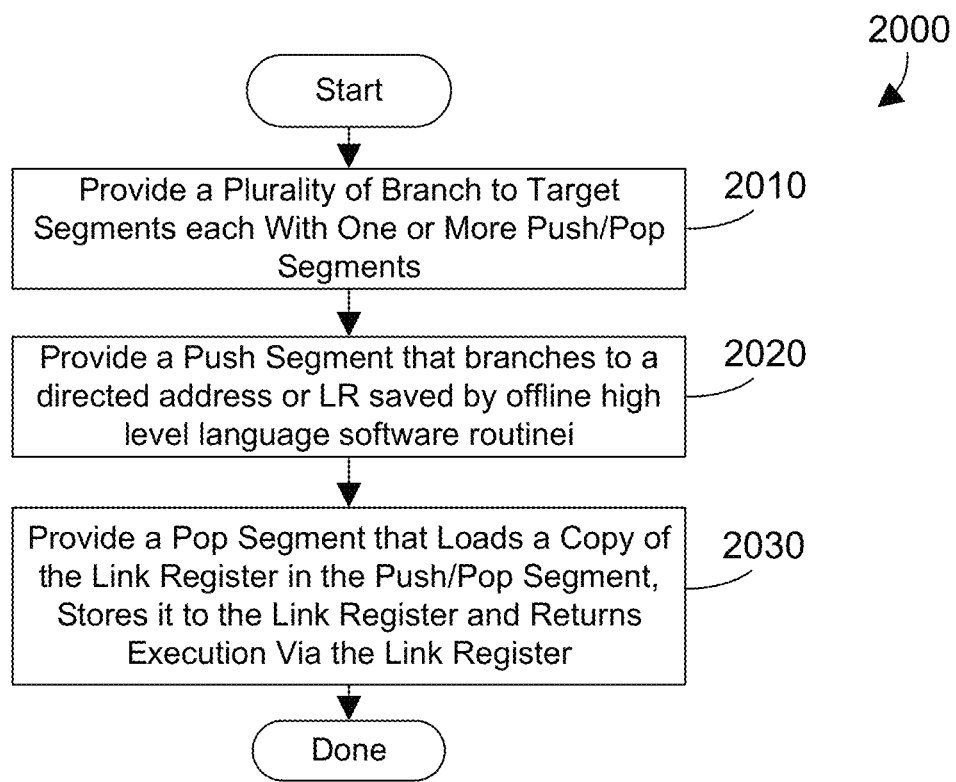
Figure 21:
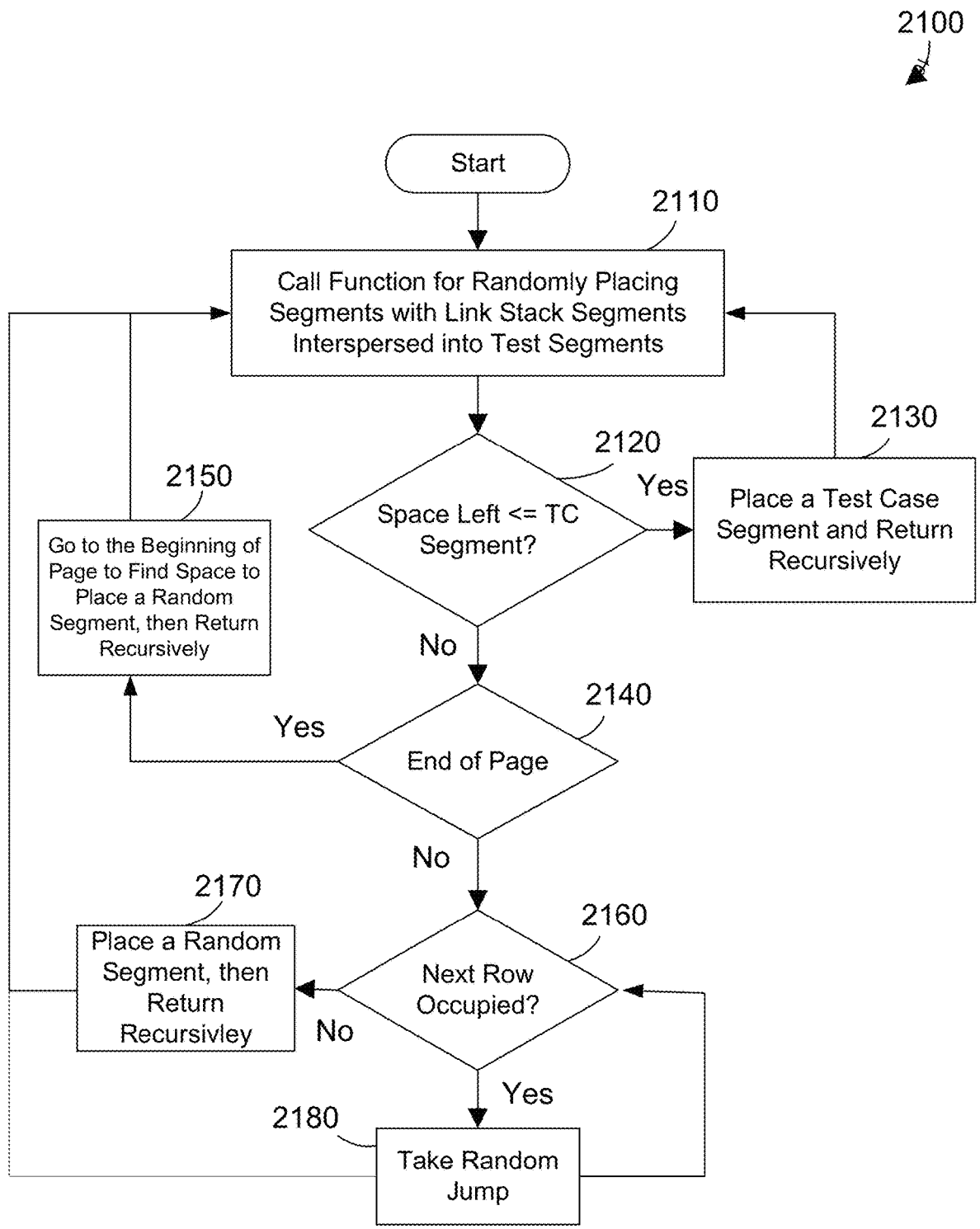

FIG. 19 is a flow diagram of a method for stress testing a processor memory cache with a variable link stack depth using link stack test segments with non-naturally aligned data boundaries;

FIG. 20 is a flow diagram of a specific method for step 1920 in FIG. 19;

FIG. 21 is a flow diagram of a specific method for step 1930 in FIG. 19; and FIG. 22 is an example of pseudo code for a specific method for step 1930 in FIG. 19.

DETAILED DESCRIPTION

The disclosure and claims herein relate to a system and method for a processor memory stress test with a variable link stack depth using test code segments and link stack test segments on non-naturally aligned data boundaries. Link stack test segments are interspersed into test code segments of a processor memory test to change the link stack depth without changing results of the test code. The link stack test segments include branch to target, push/pop, push and pop segments. The depth of the link stack is varied independent of the memory test code by changing the number to branches in the branch to target segment and varying the number of the push/pop segments. The link stack test segments and test segments may be placed randomly with a recursive algorithm to intersperse the link stack test segments in the test code segments and to reduce the amount of data to be saved for previous calls.

Figure 1:
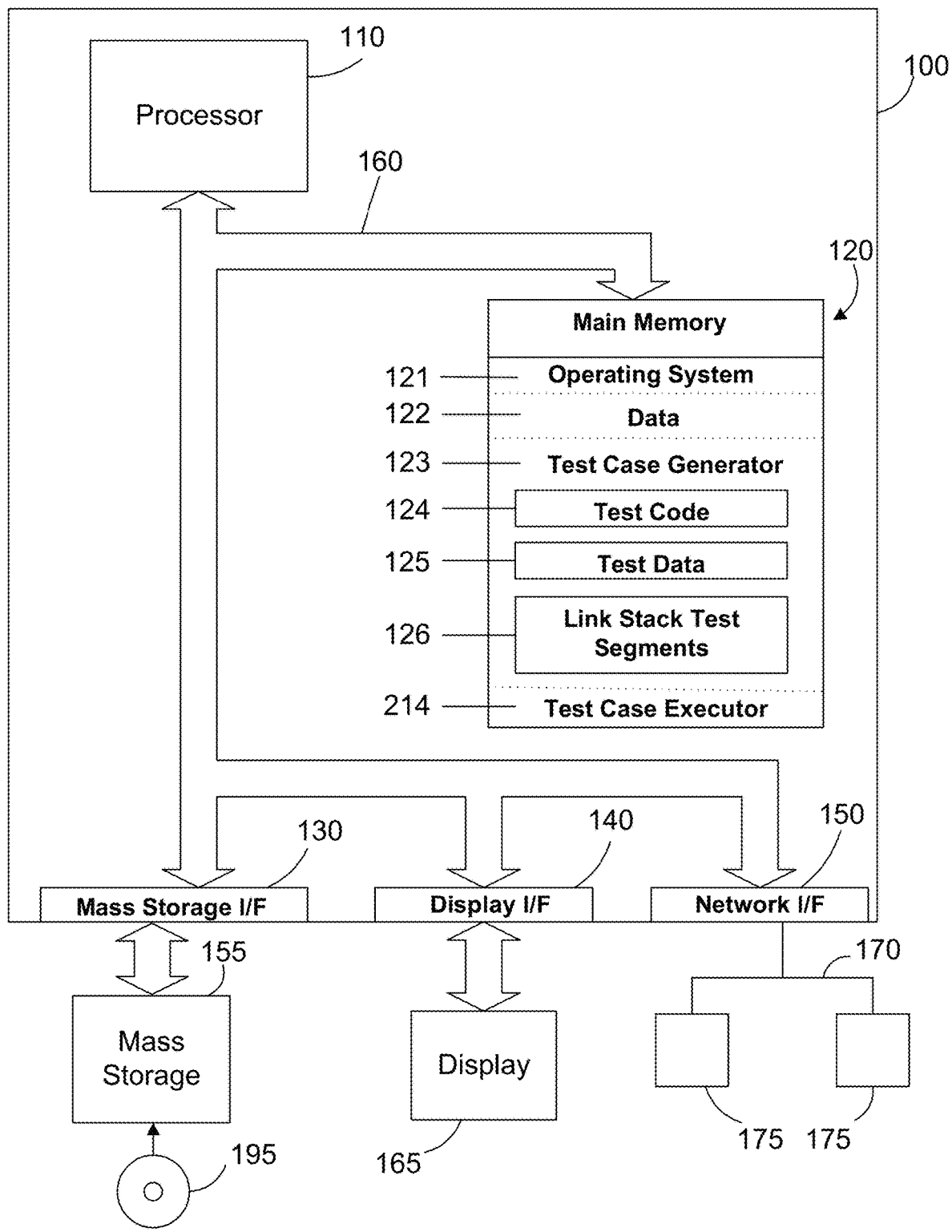
FIG. 1 is a block diagram a computer system with for controlling segment layout for stress testing a processor memory with a link stack using test code segments placed on non-naturally aligned data boundaries and interspersed with link stack test segments for varying the link stack depth.

Referring to FIG. 1, a computer system 100 is one suitable implementation of a computer system that is capable of performing the computer operations described herein including a test case generator for generating test cases for stress testing a processor memory and/or a test case executor as described herein. Computer system 100 is a computer which can run multiple operating systems including the IBM i operating system. However, those skilled in the art will appreciate that the disclosure herein applies equally to any computer system, regardless of whether the computer system is a complicated multi-user computing apparatus, a single user workstation, laptop, phone or an embedded control system. As shown in FIG. 1, computer system 100 comprises one or more processors 110. The computer system 100 further includes a main memory 120, a mass storage interface 130, a display interface 140, and a network interface 150. These system components are interconnected through the use of a system bus 160. Mass storage interface 130 is used to connect mass storage devices with a computer readable medium, such as mass storage 155, to computer system 100. One specific type of mass storage 155 is a readable and writable CD-RW drive, which may store data to and read data from a CD-RW 195. Some mass storage devices may have a removable memory card or similar instead of the CD-RW drive.

Main memory 120 preferably contains an operating system 121. Operating system 121 is a multitasking operating system known in the industry as IBM i; however, those skilled in the art will appreciate that the spirit and scope of this disclosure is not limited to any one operating system. The memory 120 further includes data 122, a test case generator 123 and a test case executor 214 as described below. The memory 120 also includes test code 124 and test data 125 which is typically created by the test case generator 123. The memory also includes link stack test segments 126 for testing the memory with different link stack scenarios as described herein. While the test code 124, test data 125 and link stack segments 126 are shown as part of the test case generator 123, these structures could alternatively be separate from the test case generator.

Computer system 100 utilizes well known virtual addressing mechanisms that allow the programs of computer system 100 to behave as if they only have access to a large, single storage entity instead of access to multiple, smaller storage entities such as main memory 120 and mass storage 155. Therefore, while operating system 121, data 122, test case generator 123, test code 124, test data 125 and link stack test segments 126 are shown to reside in main memory 120, those skilled in the art will recognize that these items are not necessarily all completely contained in main memory 120 at the same time. It should also be noted that the term "memory" is used herein generically to refer to the entire virtual memory of computer system 100, and may include the virtual memory of other computer systems coupled to computer system 100.

Processor 110 may be constructed from one or more microprocessors and/or integrated circuits. Processor 110 executes program instructions stored in main memory 120. Main memory 120 stores programs and data that processor 110 may access. When computer system 100 starts up, processor 110 initially executes the program instructions that make up operating system 121 and later executes the program instructions that make up the test case generator 123 to generate the test code 124 and the test data 125 as directed by a user.

Although computer system 100 is shown to contain only a single processor and a single system bus, those skilled in the art will appreciate that the system may be practiced using a computer system that has multiple processors and/or multiple buses. In addition, the interfaces that are used preferably each include separate, fully programmed microprocessors that are used to off-load compute-intensive processing from processor 110. However, those skilled in the art will appreciate that these functions may be performed using I/O adapters as well.

Display interface 140 is used to directly connect one or more displays 165 to computer system 100. These displays 165, which may be non-intelligent (i.e., dumb) terminals or fully programmable workstations, are used to provide system administrators and users the ability to communicate with computer system 100. Note, however, that while display interface 140 is provided to support communication with one or more displays 165, computer system 100 does not necessarily require a display 165, because all needed interaction with users and other processes may occur via network interface 150, e.g. web client based users.

Network interface 150 is used to connect computer system 100 to other computer systems or workstations 175 via network 170. Network interface 150 broadly represents any suitable way to interconnect electronic devices, regardless of whether the network 170 comprises present-day analog and/or digital techniques or via some networking mechanism of the future. In addition, many different network protocols can be used to implement a network. These protocols are specialized computer programs that allow computers to communicate across a network. TCP/IP (Transmission Control Protocol/Internet Protocol) is an example of a suitable network protocol.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 2:
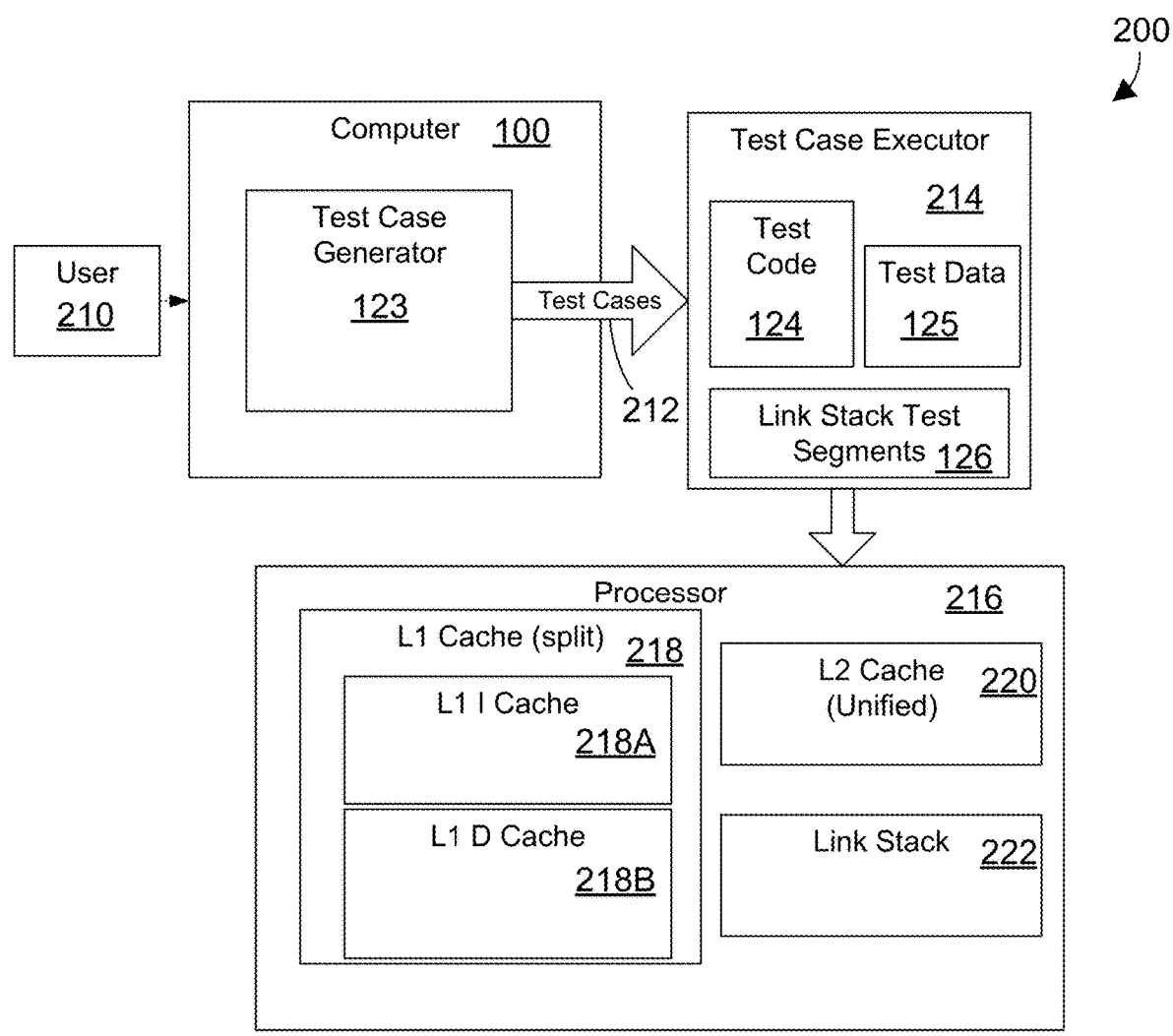
FIG. 2 illustrates simplified block diagrams of a system for testing a processor with test code and link stack test segments placed in segments of a cache with non-naturally aligned data boundaries.

FIG. 2 illustrates a simplified block diagram of a system 200 for reducing the time needed to generate test cases for testing a processor by replicating test code and test data and placing slices of the test code and test data into a memory cache where the slices of the replicated test code and test data have non-naturally aligned data boundaries. A user 210 or an operator uses the test case generator 123 to provide tests cases 212 to a test case executor 214. The test case generator 123 and the test case executor 214 operate in a manner similar to the prior art except as described herein. The test cases 212 include test code 124 and test data 125. The test case executor 214 loads the test code 124, test data 124 and the link stack test segments 126 into a processor 216 to verify and validate the processor design.

Again referring to FIG. 2, the processor 216 has a typical cache design with one or more caches. In the illustrated example, the processor 216 has a split L1 cache 218 and a unified L2 cache 220. The split L1 cache 218 means the L1 cache 218 is split between an L1 instruction cache 218A and an L1 data cache 218B. When instructions and data are needed by the processor, the processor first looks to the L1 cache 218 to load the instructions and data. If the needed instructions and data are not in the L1 cache 218, then the L2 cache is searched for the needed instructions and data and loaded into the L1 cache from the L2 cache if available. If the needed instructions and data are not in the L2 cache, then they are loaded from main memory. Alternatively an additional level of cache (L3 cache) can be used but is not shown here for simplicity. The test code 124 and test data 125 are loaded into the L2 cache 220 and then to the L1 cache 218 as described further below. The test case executor 214 replicates the test code 124, placing multiple copies of the test code into the L2 cache 220, and then the test code is executed by the processor to test proper handling of data coherency as described further below. The test case executor 214 may also replicate the test data 125 into the L2 cache 220. The processor 216 further includes a link stack 222 or call return stack that can be used to predict a target address of a branch to improve performance.

Figure 3:
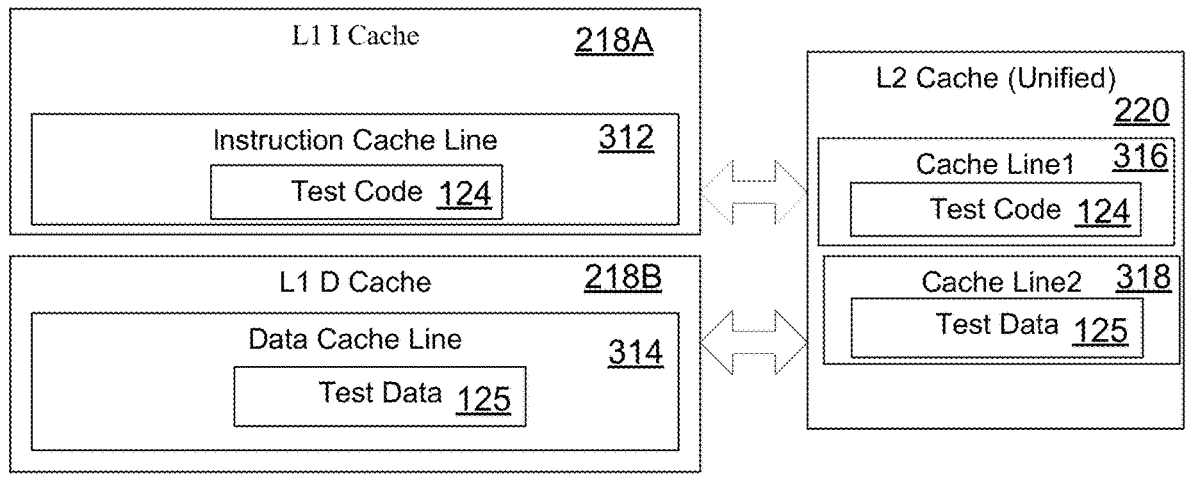
FIG. 3 is a simplified block diagram of a memory cache system in a processor with test code and test data placed in different cache lines in a level two memory cache.

FIG. 3 illustrates an example of loading the L1 cache 218 from the L2 cache 220 of the processor 216 (shown in FIG. 2) where the test code and test data are initially placed in different cache lines in the L2 memory cache. In this example, the L1 instruction cache 218A has a single instruction cache line 312. Similarly, the L1 data instruction cache 218B has a single data cache line 314. Those of ordinary skill in the art will recognize that processors may have multiple cache lines in the instruction cache and the data cache. In such a case, the operation would be similar to the described example. In this example, the test code 124 was initially loaded into cache line1 316. When test code 124 is requested by the L1 instruction cache 218A, the L2 cache 220 provides a cache line containing the requested test code, in this case test code 124 from cache line1 316. Similarly, the test data 125 was initially loaded into cache line2 318. When test data 125 is requested by the L1 data cache 218B, the L2 cache 220 provides a cache line containing the test data 125 from cache line2 318. If the test code makes changes to the test code 124 in the instruction cache line 312 or makes changes to the test data 125 in the data cache line 314 then these changes need to be pushed back to the L2 cache 220 in a manner known in the prior art. Since the test code 124 and the test data 125 are on different cache lines, this example illustrates the simple case of maintaining memory coherency between the L1 and L2 caches. If the processor or test code detects an error in data coherency between the caches or main memory, the processor being tested can be flagged as having a potential memory failure in a manner known in the prior art.

Figure 4:
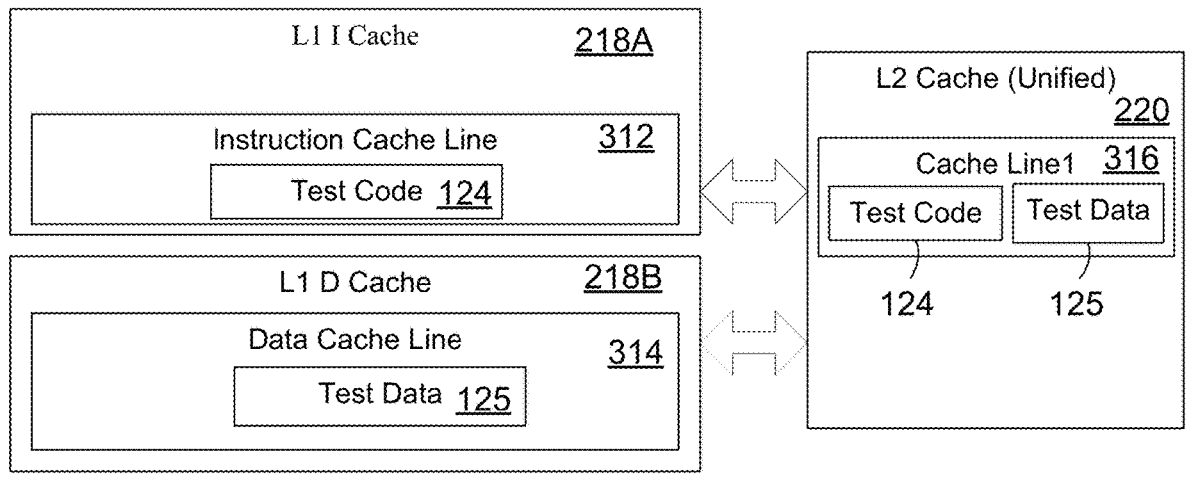
FIG. 4 is a simplified block diagram of a memory cache system in a processor with test code and test data placed in the same cache lines in a level two memory cache.

FIG. 4 illustrates another example of loading the L1 cache 218 from the L2 cache 220 of the processor 216 (shown in FIG. 2). In this example, the test code and test data are initially placed in the same cache line in the L2 memory cache. As in the previous example, the L1 instruction cache 218A and the L1 data instruction cache 218B each have a single cache line. In this example, the test code 124 was initially loaded into cache line1 316. When test code 124 is requested by the L1 instruction cache 218A, the L2 cache 220 provides the test code 124 from cache line1 316. The test data 125 was initially loaded into the same cache line1 316. When test data 125 is requested by the L1 data cache 218B, the L2 cache 220 provides the test data 125 from cache line1 316. If the test code makes changes to the test code 124 in the instruction cache line 312, or if the test code makes changes to the test data 125 in the data cache line 314 then these changes need to be reflected in the L1 cache and pushed back to the L2 cache 220. This example illustrates the case of maintaining memory coherency between the L1 and L2 caches where test code 124 and the test data 125 are loaded into the L1 cache 218 from the same cache lines in the L2 cache 220.

FIG. 5 illustrates additional detail of successive slices of the L2 memory cache with replicated test cases (tc0-1, tc1-1, etc.) placed in segments of memory with non-naturally aligned data boundaries. Thus, FIG. 5 represents a simplified representation of a portion of the level 2 cache 220 introduced above. In the illustrated example, the cache 220 illustrates four replicated slices 510 that can contain test code or test data (described further below). The table 512 above the cache data illustrates how the cache lines of the cache are divided. A cache line in the cache is divided into eight quad words 514. The quad words 514 are labeled QW0 through QW7. Each quad word 514 is divided into two double words 516. The double words for each quad word are labeled DW0 and DW1. Each double word 516 is further divided into two words 516 (not labeled). In this example, each word is four bytes of memory space. Thus each cache line has eight quad words with 128 bytes of memory. Thus the level 2 cache 220 is divided into lines of memory 520 with 128 bytes in each line. In the illustrated portion of level 2 cache 220 shown in FIG. 5, lines 1-9 and 27-35 are shown with the line number 520 shown for each line at the left side of the drawing.

Again referring to FIG. 5, the memory represented in the level 2 cache 220 is divided into slices 510 as shown. For simplification of the drawing, only four slices of the memory cache are actually shown. Slices 3 through 6 are omitted from the drawing but follow the same pattern as the other slices. Slice1 510A begins on line1 of the cache and ends near the middle of line 5. Line 5 is shown twice at the left of the drawings. This is done for illustration so that it can be clearly seen where slice1 510A ends and slice2 510B begins. In the cache there is actually only one line of memory designated as line 5. Slice2 510B begins at the end of slice1 510A near the middle of line 5 and ends near the end of line 9. Slice7 510C begins at the end of slice6 (not shown) near the middle of line 27 and ends near the end of line 31. Slice8 510D begins at the end of slice7 510C near the middle of line 31 and ends at the end of line 35.

Again referring to FIG. 5, each slice of memory 510 includes several strands of test cases. In this example, there are five strands of test cases (tc0 through tc4) divided into four segments each. The segments of each strand are shown with the same shading in FIG. 5. The segment of the strand is indicated by the number after the dash. Thus tc0-1 522 is the first segment of test case zero, tc1-1 524 is the first segment of test case one, tc2-1 526 is the first segment of test case 2, tc3-1 528 is the first segment of test case 3 and tc4-1 530 is the first segment of test case four. Test case zero (tc0) includes tc0-1, tc0-2, tc0-3 and tc0-4. Similarly the other test case strands include four segments. As can be seen using the table 512 above the cache, each of the segments has a test case that is seven words long. It is important to note that the seven word length of the segments means that each of the test cases are on non-naturally aligned word boundaries. Non-naturally aligned means that when the segments of the test cases are placed end-to-end the end of the segments does not fall on a natural boundary that is a number of the form $2^n$. This is accomplished by having segments with an odd number of words. In this example this means that the beginning and end of each of the test case segments does not line up with 32 byte, cache line (128 byte) and page crossing boundaries. For example, the page crossing boundary 532 is within the test case tc1-1 at the boundary between line 31 and line 32 as shown in FIG. 5. Since the segments are non-naturally aligned, after replication alignment boundaries change for tests on subsequent segments to allow more robust testing of the processor using the same repeated test code. In cases where alignment boundaries need to be respected for a few instructions, these instructions are placed in sub-segments with special alignment locations so that they preserve alignment even after replication and re-execution on new segments as described below.

FIG. 6 further illustrates a portion of the memory cache shown in FIG. 5 having test cases with test code and test data on non-naturally aligned data boundaries. FIG. 6 illustrates the first two strands of the five strands of test cases shown in FIG. 5, namely tc0 610 and tc1 612. Test case zero (tc0)

610 includes four segments 610A, 610B, 610C and 610D. Similarly, test case one (tc1) 612 includes four segments 612A, 612B, 612C and 612D. As described above, each segment of the cache has a test case that is seven words long. The test case segment is divided into three sub-segments. In this example, the sub-segments include a quad word, a double word and a single word for a total of seven words. The order of the sub-segments changes for each segment in the test case strand in order that the test cases within the strings can observe word boundaries where needed. The first segment 610A of test case zero (tc0) has a quad word followed by a word and then a double word. In the next segment of tc0 610B there is a word, a quad word and then a double word. In the next segment of tc0 610C there is a double word, a quad word and then a single word. In the final segment of tc0 610D there is a single word, a double word and then the quad word. Similarly the tc1 alternates the single word, double word and quad word in subsequent segments as shown in 612A, 612B, 612C and 612D.

In the example described above, each segment of the test cases has seven words to ensure that the test case data has non-naturally aligned data boundaries. By having non-naturally aligned data boundaries for each segment of the slice of test data, testing can be done on the replicated test cases to test various boundaries. These boundaries include 32 byte boundaries, cache line boundaries (128 bytes) and page crossing boundaries. The test case segment is divided into sub-segments of word, double word and quad word and the order of the sub-segments changes for each segment in the test case strand. Dividing into sub-segments and changing of the order of the sub-segments insures that the data for test cases within the sub-strings can observe and preserve double word and quad word boundaries where needed. Using non-naturally aligned data boundaries with replicated code insures that all types of segments will cross the boundaries at some replication of the test data. This allows testing of the boundaries without using special code to look at the restrictions of a particular segment for each of the boundaries.

The examples described above illustrate a preferred test case segment with 7 words to achieve non-naturally aligned data boundaries. Other non-naturally aligned data boundaries could include other odd numbers such as 5, 9, 11, etc. A combination of word, double word and quad word could be chosen as sub-segments for these segments similar to the described example. For example, for a segment with 9 words, a quad word, two double words and a word would achieve the correct number of sub-segments for 9 words. The sub-segments could be changed for each segment in a strand as described above for the 7 word example.

FIG. 7 illustrates a portion of the memory cache shown in FIG. 5. The memory shown in FIG. 7 is a sequence of segments or a strand of memory 700 shown as a single block. The strand of memory 700 may be modified to include link stack scenarios to stress test memory and the link stack as described herein. In this example, the strand of memory 700 includes the strand segments 610 described in FIG. 6. Each of the segments in this example includes seven words of memory. Segment 610A includes seven words of memory a1 through a7. Similarly, segments 610B, 610C and 610D each include seven words of memory. Additional segments labeled as e, f, g, h, and i are also shown in the strand 700. These segments are not consecutive memory locations, but are shown here as a block of memory that are logically in the strand and used for testing the cache memory of the processor 216 (FIG. 2). In this example, each segment 610 of the strand 700 is loaded with a test case for testing memory by the test case executor 214 as described above. In addition, the test case executor 214 may load link stack test blocks into the strand 700 as described below.

FIG. 8 illustrates another view of a portion of memory used for stress tests as described herein. FIG. 8 includes the same strand of memory 700 shown in FIG. 7 where the strand is arranged as a single block 800. In FIG. 8, the strand of memory 700 has been modified to include link stack test segments to stress test memory. The link stack scenarios are added to the test cases in the strand of memory 700 by adding link stack test segments 126. The link stack test segments 126 include a push segment 810 and a pop segment 812. The push segment 810 and the pop segment 812 may be located at a suitable known location in memory and maybe outside the strand of memory 700. The same push segment 810 and the pop segment 812 may be used by multiple different test cases. The push segment 810 and the pop segment 812 are described further below. The stack test segments 126 further include a branch to target segment 814 with one or more corresponding push/pop segments 816. In this example, there are two push/pop segments 816. Each of the link stack test segments 126 is described further below.

FIG. 9 illustrates an example of a branch to target segment 814 introduced in FIG. 8. Like the all the link stack test segments 126, the branch to target segment 814 is a single segment. In the illustrated examples, the segments each have seven words with data or instructions. The branch to target segment 814 has one or more branch conditional link to target (bcl tgt) instructions 910. These bcl tgt instructions can also be considered as a sub-routine call. Thus the bcl tgt instructions 910 are branch instructions or subroutines calls that call target segments in the strand as described in the example below. In the illustrated example, all the bcl sub-routine calls 910 branch to "tgt" for illustration. In an actual implementation, these calls could have a unique target name. The last word 912 in the branch to target segment 814 is a branch instruction that branches to the next strand of test code shown in FIG. 5. Any unused words of the branch to target segment 814 are filled with no operation (nop) instructions 914.

FIG. 10 illustrates an example of a push/pop segment 816 introduced in FIG. 8. The push/pop segment 816 serves to increase the depth of the link stack to stress test the memory as described above. A link register in the processor holds the last entry of the link stack. Upon entry into the push/pop segment 816, the link register holds the address of the instruction following the call to the push/pop segment 816. The first instruction, "mfLR r3" 1010, moves the contents of the link register to register r3. The next instruction 1012 is a sub-routine call to the push segment 810. The push segment 810 stores the contents of the register r3 in the LR save area 1014 as described below. The push/pop segment 816 then has one or two sub call instructions 1016. The sub call instruction 1016 branches to a sub-routine in the memory strand 700. Upon return from the sub-routine the next instruction is the pop instruction 1018. The pop instruction 1018 is a branch to the pop segment 812. Branching to the pop segment returns instruction flow to the address stored in the LR save area 1014 as described below. The push/pop segment may have an unused location 1020. The push/pop segment 816 increases the stack depth by making a call to the push segment. Any testing done after the call to the push segment 816 has a stack depth increased by one. Adding additional push/pop segments allows the test programmers to force the testing to be done at any desired stack depth for tests between the push/pop segments.

FIG. 11 illustrates an example of a push segment 810 introduced in FIG. 8. The purpose of the push segment is to store a return address for a corresponding pop segment 812. The push segment 810 stores the return address in a link register (LR) save area 1014 in the push/pop segment 816 that called the push segment 810 as described above. When the push segment 810 begins, register r3 already contains the return address to be stored (see the first instruction of the push/pop segment 816). The first instruction of the push segment 810 is "mfLR r4" 1110. This first instruction is a "move from link register" instruction. The instruction thus moves the contents of the link register to register r4 of the processor. The link register holds a return address to continue execution following a branch. In this case, the link register holds the address pointing to the next instruction inside the push/pop segment that called the push segment. Thus the link register holds the address to the "sub call" instruction in the push/pop segment. The address of the LR save area 1014 where the return address is to be stored is 16 bytes beyond this address in the link register. Thus, the store instruction "std r3, 16(r4)" 1112 stores the contents of register r3 at the address in register r4 plus 16 bytes. The move to link register instruction 1114 moves the contents of register r4 to the link register. This restores the link register to point to the address just as it was prior to the instruction 1110. The branch instruction 1116 then branches using the restored link register to branch back to the next instruction in the push/pop segment that called the push segment 810.

FIG. 12 illustrates an example of a pop segment 812 introduced in FIG. 8. The purpose of the pop segment is to retrieve the return address from the LR save area 1016 and then branch back to the instruction subsequent to the branch call that originally called the push/pop segment. Thus the pop segment 812 does the inverse of the push segment 810. The first instruction of the pop segment 812 is "mfLR r3" 1210. This instruction moves the contents of the link register to register r3 of the processor. The link register holds the address pointing to the next instruction inside the push/pop segment that called the pop segment 812. Thus the link register holds the address to the "unused" instruction in the push/pop segment. The address of the LR save area 1014 where the return address is stored is 4 bytes beyond this address in the link register. Thus the load instruction "ld r3, 4(r3)" 1212 loads register r3 with the address stored in register r3 plus 4 bytes, which is the return address stored in the LR save area 1016. The move to link register instruction 1214 moves the contents of register r3 to the link register. This restores the link register to point to the address just as it was prior to the instruction 1210. The branch instruction 1216 then branches using the restored link register to branch back to the next instruction prior to branching to the push/pop segment, which in some cases will be the next bcl target instruction in the bcl target segment 814. Any unused words of the pop segment 812 may be filled with no operation (nop) instructions 1220.

FIG. 13 illustrates an example of stress testing a processor memory having a link stack using link stack test segments with non-naturally aligned data boundaries. FIG. 13 represents the strand of memory 700 as described in FIG. 8. Row and column numbers have been added to allow reference to each memory location. In the example of FIG. 13, the strand of memory 700 has been filled with a specific example of a bcl target segment 814 and push/pop segments 816A and 816B. In this example, we assume execution of the tests begin at instruction a1 (col. 1, row 1). The last instruction of the first segment includes a branch instruction bc+112 (col. 7, row 1). This instruction causes execution to advance 112 bytes forward to continue with the first instruction of the next segment of this strand (col. 1, row 2). The second row is executed similar to the first row. Execution then advances to the branch to target segment 810. The first instruction is a branch to target (col. 1, row 3). As used in this example, branch to target (bcl tgt) means branch to the location pointed to by the arrow.

Continuing with the example of FIG. 13, the first instruction in the branch to target segment 814 indicates to branch to col. 1, row 4. The instruction at this location moves the contents of the link register to register r3. Register r3 will now hold the address of col. 2, row 3, which is the next address from the branch instruction. The next instruction is the push call at col. 2, row 4. This is a branch instruction to the push segment 810 described above with reference to FIG. 11. The push segment 810 stores the address in register r3 in the LR save area (col. 7, row 4) of this segment as described above. After the push call, the subroutine call (col. 3, row 4) branches execution to c1 (col. 1, row 5). Execution continues through rows 5 and 6 until the return instruction (col. 7, row 6) branches execution to the nop instruction (col. 4, row 4). The next instruction is then the pop branch instruction (col. 5, row 4). The pop branch instruction branches execution to the address stored in LR save area by the push segment as described above. In this case, the pop branch instruction causes execution to continue with the second "bcl tgt" instruction (col. 2, row 3). The second "bcl tgt" instruction (col. 2, row 3) causes execution to branch to instruction e1 (col. 1, row 7). Execution then continues from e1 through instruction f6 and then returns to the third "bcl tgt" instruction (col. 3, row 3). The third "bcl tgt" instruction branches execution to instruction g1 (col. 1, row 9). After instruction g6, the branch (col. 7, row 9) sends execution to the second push/pop segment 816B. This push/pop segment 816B operates similar to the previous one. After pushing the link register contents to the LR save area (col. 7, row 7) execution continues with the test code in rows 11 and 12. The return (col. 7, row 12) branches execution to the nop instruction (col. 4, row 10) and then to the pop branch instruction (col. 5, row 10). The pop instruction (col. 5, row 10) sends execution to the nop instruction (col. 4, row 3) in the branch to target segment 810. Execution then continues in row 3 to the "bc next" instruction (col. 7, row 3) that branches to the next strand of the tests.

In the example described above with reference to FIG. 13, it can be seen that the addition of the link stack test segments, including the branch to target segment 814 and the push/pop segments 816A, 816B can be done such that they do not affect the execution of the original block of tests a1-a6 through i1-i6 as shown in FIG. 7. The addition of the link stack test segments 126 serve to modify the depth of the link stack for stress testing the link stack hardware without changing the results or requiring the substantive modification of the general test software used for the memory cache testing. The sequence of the test code stays the same but the stack depth is increased. In the above example, the only changes to the general test software were to change the final instruction from a branch to the next segment (bc+112) to a return instruction to match the sub-routine calls in the push/pop segment and the bcl target instructions (subroutine calls) in the branch to target segment 810. Changing the last instruction to a "return" may be done pseudo randomly to further randomize the stack depth of the test code. No substantive changes were made to the general test software. Thus, any number of branch to target segments 810 and push/pop segments 812A, 812B can be added to put the depth of the link stack to various values during testing without substantive modification of the test code.

Referring to FIG. 14, a method 1400 shows one suitable example for stress testing the link stack in a processor memory cache using segments with non-naturally aligned data boundaries. Portions of method 1400 are preferably performed by the test case generator 123 shown in FIG. 1 and the test case executor 214 shown in FIG. 2. First, provide test code for testing a memory in a strand of non-consecutive memory segments with non-naturally aligned data boundaries (step 1410). Next, place a plurality of link stack test segments interspersed into the test code segments (step 1420). Execute the test code to test the memory while executing the interspersed push and pop segments to vary the link stack depth without changing results of the test code and independent of the test code (step 830). Method 1400 is then done.

FIG. 15 shows one suitable example of a method 1500 to place a plurality of link stack test segments interspersed into the test code segments. Method 1500 thus shows a suitable method for performing step 1420 in method 1400 in FIG. 14. First, provide a plurality of branch to target segments each with one or more push/pop segments (step 1510). Provide a push segment that pushes a copy of a link register to a link register save area within the push/pop segment (step 1520). Provide a pop segment that loads a copy of the link register from the link register save area in the push/pop segment and stores it to the link register, and then returns execution via the link register (step 1530). The method 1500 is then done.

In the examples described above with reference to FIG. 9 through FIG. 15, the link stack test segments in FIGS. 10-12 are placed in the block of memory 800 as shown in FIG. 13. In the previous example, when doing a subroutine call or placing a push segment, a call to a push/pop segment required saving the current link register (LR), initialize a new LR, and then branching to the LR address (sub routine call). A POP would then branch back to where LR was pointing. Thus the push/pop segment 816 in the above example stores the contents of the link register to register r3 before the push segment 810 is called. The push segment 810 stores the return address in a link register (LR) save area 1014 in the push/pop segment 816 that called the push segment 810 as described above. The above method has the disadvantage that it requires additional links to be stored in the LR save area 1014 and the local return addresses must be stored. The above method thus requires additional instructions for this housekeeping of return addresses. The above method requires using more of the link stack and slows testing by increasing the time between potential tests.

Another method of placing link stack test segments into test code will be described with reference to FIGS. 16 through 22. In this method, the link stack segments and test segments are placed into the test code by a software subroutine or module in a high level software language such as "C" or "C++". The high level language subroutine is preferably a recursive routine that randomly places the link stack test segments and test segments as described below. The high level language subroutine is able to place the link stack test segments such that the link stack test segments do not need space to store the contents of the link register as described above. The high level subroutine will store the value of LR in some storage location like register like R4 so that the link stack segment can just load from R4 and do "blr". This saves many instructions that were used for "housekeeping" to keep track of the return addresses in the example described above. The high level software subroutine uses an Application Binary Interface to pass the value of the LR into register R4 or another suitable location. Using the high level language software routine for placement of link stack test segments requires fewer instructions thus saving space and allowing the test segments to branch forward and backward at a higher speed.

FIG. 16 illustrates another example of a push/pop segment 1616 which is similar to the push/pop segment 816 introduced in FIG. 8. The push/pop segment 1616 serves to increase the depth of the link stack to stress test the memory as described above. Upon entry into the push/pop segment 1616, the link register holds the address of the instruction following the call to the push/pop segment 1616. In this example, the first instruction of the push/pop segment 1616 is a nop instruction 1610. An instruction to move the contents of the link register is not needed in this example because the push and pop segments will use addressing supplied by the high level language software that is placing the link stack test segments into the code. The next instruction 1612 is a sub-routine call to the push segment 1710 as described below. The push/pop segment 1616 may then have one or two subroutine call instructions 1616. The subroutine call instruction 1616 branches to a sub-routine in the memory strand 700 as described above. Upon return from the sub-routine calls 1616, the next instruction is the pop instruction 1618. The pop instruction 1618 is a branch to the pop segment 1810. Branching to the pop segment 1810 returns instruction flow to the address stored in the link register as described below. The push/pop segment may have unused locations indicated by the nop 1610. In this segment and the other segments, the nop instructions 1610 could alternatively be replaced with additional test code instructions. Similar to the previous example, the push/pop segment 1616 increases the stack depth by making a call to the push segment. Any testing done after the call to the push segment 1616 has a stack depth increased by one. Adding additional push/pop segments allows the test programmers to force the testing to be done at a randomly varied stack depth.

FIG. 17A illustrates an example of a push segment 1710A. The push segment 1710A is similar to the push segment 810 introduced in FIG. 8. The purpose of the push segment 1710A is to store a return address for a corresponding pop segment 1810 described below. The push segment 1710A may have a number of nop instructions 1712. The push segment 1710A does not need to store the return address in a link register (LR) save area as described in the previous example above. In this example, the push segment branches to a link register address saved offline by the high level language software subroutine. The link register address holds a return address to continue execution following a branch. In this example, the link register instruction 1714 moves the contents of register r4 to the link register. The contents of register r4 was previously set to hold the return address to the push/pop segment by the high level language software routine. The branch link register instruction 1716 then branches back to the next instruction in the push/pop segment that called the push segment 810. The nop instructions 1712 indicate an unused location or "no operation".

FIG. 17B illustrates another example of a push segment 1710B similar to the push segment 1710A introduced above. The push segment 1710B may have a number of nop instructions 1712. In this example, a link register instruction to move the contents of register r4 is not needed. Instead, a branch absolute instruction 1718 is used to branch back to the next instruction in the push/pop segment that called the push segment 810. The high level is aware of the needed branch location and is able to calculate the address offline and set the branch absolute instruction 1718 to the need address when the push segment is placed into memory.

FIG. 18 illustrates an example of a pop segment 1810 that is similar to the pop segment 810 introduced in FIG. 8. The purpose of the pop segment 1810 it to branch back to the instruction subsequent to the branch call that originally called the push/pop segment. Thus the pop segment 1810 does the inverse of the push segment 1710. The branch instruction 1814 branches using the link register to branch back to the next instruction prior to branching to the push/pop segment, which in some cases will be the next bcl target instruction in the bcl target segment 814. Any unused words of the pop segment 1810 may be filled with no operation (nop) instructions 1812.

Stress testing the link stack in a processor memory cache using the above push/pop, push and pop segments can be accomplished similar to the previous example described above with reference to FIG. 9 through FIG. 15. Similar to above, in this example test code segments for testing a memory in a strand of non-consecutive memory segments with non-naturally aligned data boundaries is interspersed with the link stack test segments. In this example, the plurality of link stack test segments and test segments are randomly placed into the memory using a high level language software subroutine that preferably uses a recursive subroutine structure to intersperse the link stack test segments in the test segments as described below. When the test segments and link stack segments are randomly placed in memory, the high level language subroutine keeps track of the link stack push and pop segments to insure the integrity of the push and pop structure is balanced as described more below. The high level language subroutine may also use one or more pointers or counters to insure a balance between test segments and link stack segments. The test code can then be executed to test the memory while executing the interspersed push and pop segments to vary the link stack depth without changing results of the test code and independent of the test code.

As introduced above, when the test segments and link stack segments are randomly placed in memory, the high level language subroutine keeps track of the link stack push and pop segments to insure the integrity of the push and pop structure is balanced. The segments may be randomly placed as described herein but within the constraints of keeping the push pop structure balanced. The high level language software subroutine insures that all pop segments when placed have a corresponding push segment as described above. For example the high level language subroutine can check when a random "pop" segment is chosen to check if there was a previous push segment. If not, the random selected segment can be appropriately modified.

The high level language subroutine may also track the random placement of test segments and link stack segments. This can be done using pointers or counters as introduced above. The high level language subroutine may use pointers to a list of test code segments. Each time a test code segment is placed the pointer or counter can be updated to indicate how many of each type of segments still need to be placed. The pointers or counters can also be used to insure the random subroutine does not place the same segments too often. Further, the pointers and counters can be used to keep track of how many test segments still need to be placed.

Referring to FIG. 19, a method 1900 shows one suitable example for an example of stress testing a processor memory cache with a link stack using test code segments with non-naturally aligned data boundaries interspersed with the link stack test segments using a high level language subroutine. Portions of method 1900 are preferably performed by the test case generator 123 shown in FIG. 1 and the test case executor 214 shown in FIG. 2. First, provide test code for testing a memory in a strand of non-consecutive memory segments with non-naturally aligned data boundaries (step 1910). Next, provide a plurality of link stack test segments for placement into the test code segments (step 1920). Then randomly place the plurality of link stack test segments interspersed with the test code segments into the memory (step 1930). Execute the test code to test the memory while executing the interspersed push and pop segments to vary the link stack depth without changing results of the test code and independent of the test code (step 1940). Method 1900 is then done.

FIG. 20 shows one suitable example of a method 2000 to provide a plurality of link stack test segments for placement into test code segments. Method 2000 thus shows a suitable method for performing step 1920 in method 1900 in FIG. 19. First, provide a plurality of branch to target segments each with one or more push/pop segments (step 2010). Provide a push segment that branches to a directed address or link register saved by the offline high level language software routine (step 2020). Provide a pop segment that returns execution via the link register (step 2030). The method 2000 is then done.

FIG. 21 shows one suitable example of a method 2100 for randomly placing the plurality of link stack test segments interspersed in with the test code segments in the memory. Method 2100 thus shows a suitable method for performing step 1930 in method 1900 in FIG. 19. First, call the function for randomly placing segments with link stack test segments interspersed into test segments to test with varying the link stack depth (step 2110). If the space left is less than or equal to a test code segment (step 2120=yes) then place a test code segment if possible and return to recursion function (step 2130). If the space left is not less than or equal to a test code segment (step 2120=no) then check if at end of the page (step 2140). If at the end of page (step 2140=yes) then go to the beginning of the page to find space to place a random segment and then return recursively (step 2150). If not at the end of the page (step 2140=no) then check if next row is occupied (step 2160). If the next row is not occupied (step 2140=no) then place a random segment and return recursively (step 2170). If the next row is occupied (step 2140=yes) then take a random jump and return recursively (step 2180). The method continues until all recursive calls are completed.

FIG. 22 is an example of pseudo code for implementing method 2100 in FIG. 21. The pseudo code in FIG. 22 illustrates an example of using a bias value to control the flow of the recursive subroutine. If one of the initial states is not present that set the bias value, a random value may be generated for the bias value. The subroutine then continues based on the bias value, whether set randomly or by the initial states for space_left, end_of_TC_page, or next_row_occupied as described further below.

Again referring to FIG. 22, the example pseudo code first determines three initial conditions and sets the bias value based on those conditions 2210. If the space_left is less than or equal to the test code segments left that need to be placed then the page is running out of space so the bias value is set to 1 to force placement of a test case segment. If end_of_TC_page, then the bias value is set to 5 to force a return to a previous call of the recursive routine. If the next_row_occupied then the bias value is set to 2. If none of these three conditions 2210 are met, then the bias value is set to a random value 2212. The subroutine 2200 then proceeds based on the bias value. If the bias value is equal to one, then the routine checks if the entire test code segment can be placed. If the entire segment cannot be placed at the current location, then fill the remaining segment with nop and go to the next segment to place the test case segment. Then update the current pointer 2214 of the segment placed. If the bias value is equal to 2, then the routine takes a random jump in the page space and places a random segment if the space is free, updates the current pointer 2214 of the segment and recursively calls itself recursively. If the bias value is 3, then the subroutine places a random segment (link stack segment or test segment). If the bias value is equal to 4, then the subroutine calls itself recursively. If the bias value equals 5, then the subroutine goes to the beginning of the page of memory and searches for an empty space to place a random segment and then returns to the previous call of itself (the subroutine Layout_segments_recursively).

The disclosure and claims herein relate to a system and method for stress testing a memory with a variable link stack depth using link stack test segments with non-naturally aligned data boundaries. Link stack test segments are interspersed into test code of a processor memory tests to change the link stack depth without changing results of the test code. The link stack test segments and test segments may be randomly placed with a recursive algorithm to automatically intersperse the link stack test segments in the test code and reduce the amount of data to be saved for previous calls.

The claims and disclosure herein support an apparatus for testing a computer processor comprising: at least one processor; a memory coupled to the at least one processor; a test case generator residing in the memory and executed by the at least one processor, wherein the test case generator allows a user to create test code segments with test cases for testing the computer processor and a plurality of link stack test segments for varying the depth of the link stack; a test case executor residing in the memory and executed by the at least one processor, wherein the test case executor replicates the test code segments and loads the replicated test code segments and link stack test segments into non-naturally aligned segments of consecutive memory locations on the computer processor; wherein the test case executor randomly places the plurality of link stack test segments interspersed in with the replicated test code segments into the non-naturally aligned segments of consecutive memory locations using a high level language subroutine; and wherein the computer processor executes the test code with the link stack test segments to test the memory of the computer processor with varying depth of the link stack independent of the test code.

The claims and disclosure herein further support a computer-implemented method executed by at least one processor for testing a computer processor comprising: providing test code in a plurality of test code segments for placement in segments of a memory with non-naturally aligned boundaries; providing a plurality of link stack test segments for placement into the test code segments; randomly placing the plurality of link stack test segments interspersed in with the plurality of the test code segments into the segments of memory with non-naturally aligned boundaries using a high level language subroutine; and executing the test code with the interspersed link stack test segments to change a link stack depth without changing results of the test code.

The claims and disclosure herein further support a computer-implemented method executed by at least one processor for testing a computer processor comprising: providing test code in a plurality of test code segments for placement in segments of a memory with non-naturally aligned boundaries, wherein non-naturally aligned means ends of the test code segments when placed end-to-end with another test code segment do not fall on a natural boundary of the memory that is a number of the form $2^n$; providing a plurality of link stack test segments for placement into the test code segments; randomly placing the plurality of link stack test segments interspersed in with the plurality of the test code segments into the segments of memory with non-naturally aligned boundaries using a recursive high level language subroutine, wherein the recursive high level language subroutine uses a bias value that may be set to a random value in a previous recursion of the recursive high level language subroutine; wherein the link stack test segments comprise: a branch to target segment that comprises a plurality of branches to sub-routines of test code; and a push/pop segment that branches to a push segment, branches to a test segment, and then branches to a pop segment; and executing the test code with the interspersed link stack test segments to change a link stack depth without changing results of the test code.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. An apparatus for testing a computer processor comprising:
   at least one processor;
   a memory coupled to the at least one processor;
   a test case generator residing in the memory and executed by the at least one processor, wherein the test case generator allows a user to create test code segments with test cases for testing the computer processor and a plurality of link stack test segments for varying the depth of the link stack;
   a test case executor residing in the memory and executed by the at least one processor, wherein the test case executor replicates the test code segments and loads the replicated test code segments and link stack test segments into non-naturally aligned segments of consecutive memory locations on the computer processor;
   wherein the test case executor randomly places the plurality of link stack test segments interspersed in with the replicated test code segments into the non-naturally aligned segments of consecutive memory locations using a high level language subroutine; and
   wherein the computer processor executes the test code with the link stack test segments to test the memory of the computer processor with varying depth of the link stack independent of the test code.

2. The apparatus of claim 1 wherein the high level language subroutine that places the link stack test segments and test segments is a recursive high level language subroutine.

3. The apparatus of claim 2 wherein the recursive high level language subroutine uses a bias value that may be set to a random value in a previous recursion of the recursive high level language subroutine.

4. The apparatus of claim 3 wherein the bias value is set to a specific value when running out of space for placing segments to force a return to a previous call of the recursive high level language subroutine.

5. The apparatus of claim 1 wherein the link stack test segments comprise:
   a branch to target segment that comprises a plurality of branches to sub-routines of test code; and a push/pop segment that branches to a push segment, branches to a test segment, and then branches to a pop segment.

6. The apparatus of claim 5 wherein the push segment uses a link register address saved offline by the high level language software subroutine in a register.

7. The apparatus of claim 6 wherein the pop segment returns execution via the link register.

8. The apparatus of claim 1 wherein the replicated test code in the non-naturally aligned segments have seven words of test code with one single word sub-segment, one double word sub-segment and one quad word sub-segment.

9. A computer-implemented method executed by at least one processor for testing a computer processor comprising:
  providing test code in a plurality of test code segments for placement in segments of a memory with non-naturally aligned boundaries;
  providing a plurality of link stack test segments for placement into the test code segments;
  randomly placing the plurality of link stack test segments interspersed in with the plurality of the test code segments into the segments of memory with non-naturally aligned boundaries using a high level language subroutine; and
  executing the test code with the interspersed link stack test segments to change a link stack depth without changing results of the test code.

10. The method of claim 9 wherein the high level language subroutine that places the link stack test segments and test segments is a recursive high level language subroutine.

11. The method of claim 10 wherein the recursive high level language subroutine uses a bias value that may be set to a random value in a previous recursion of the recursive high level language subroutine.

12. The method of claim 11 wherein the bias value is set to a specific value when running out of space for placing segments to force a return to a previous call of the recursive high level language subroutine.

13. The method of claim 9 wherein the link stack test segments comprise:
  a branch to target segment that comprises a plurality of branches to sub-routines of test code; and
  a push/pop segment that branches to a push segment, branches to a test segment, and then branches to a pop segment.

14. The method of claim 13 wherein the push segment uses a link register address saved offline by the high level language software subroutine in a register.

15. The method of claim 9 wherein the pop segment returns execution via the link register.

16. The method of claim 9 wherein the replicated test code in the non-naturally aligned segments have seven words of test code with one single word sub-segment, one double word sub-segment and one quad word sub-segment.

17. A computer-implemented method executed by at least one processor for testing a computer processor comprising:
  providing test code in a plurality of test code segments for placement in segments of a memory with non-naturally aligned boundaries, wherein non-naturally aligned means ends of the test code segments when placed end-to-end with another test code segment do not fall on a natural boundary of the memory that is a number of the form $2^n$;
  providing a plurality of link stack test segments for placement into the test code segments;
  randomly placing the plurality of link stack test segments interspersed in with the plurality of the test code segments into the segments of memory with non-naturally aligned boundaries using a recursive high level language subroutine, wherein the recursive high level language subroutine uses a bias value that may be set to a random value in a previous recursion of the recursive high level language subroutine;
  wherein the link stack test segments comprise:
    a branch to target segment that comprises a plurality of branches to sub-routines of test code; and
    a push/pop segment that branches to a push segment, branches to a test segment, and then branches to a pop segment; and
  executing the test code with the interspersed link stack test segments to change a link stack depth without changing results of the test code.

18. The method of claim 17 wherein the bias value is set to a specific value when running out of space for placing segments to force a return to a previous call of the recursive high level language subroutine.

19. The method of claim 17 wherein the push segment uses a link register address saved offline by the high level language software subroutine in a register.

20. The method of claim 17 wherein the pop segment returns execution via the link register.

* * * * *